United States Patent [19]
Ross

[11] Patent Number: 5,105,181
[45] Date of Patent: Apr. 14, 1992

[54] METHOD AND ELECTRICAL MEASURING APPARATUS FOR ANALYZING THE IMPEDANCE OF THE SOURCE OF AN ACTUAL ALTERNATING VOLTAGE

[75] Inventor: Guy Ross, Quebec, Canada
[73] Assignee: Hydro-Quebec, Montreal, Canada
[21] Appl. No.: 568,713
[22] Filed: Aug. 17, 1990
[51] Int. Cl.$^5$ ............................................. G08B 21/00
[52] U.S. Cl. .................... 340/657; 340/654; 324/133; 324/72.5
[58] Field of Search ............. 340/654, 657, 656, 660, 340/662; 324/133, 72, 72.5; 361/78

[56] References Cited

U.S. PATENT DOCUMENTS 3,956,697 5/1976 Néry ................................ 340/654 X

*Primary Examiner*—Jin F. Ng
*Assistant Examiner*—Jeffery A. Hofsass
*Attorney, Agent, or Firm*—Oblon, Spivak, McClelland, Maier & Neustadt

[57] ABSTRACT

A method and an electrical measuring apparatus for analyzing an actual alternating voltage present on an electrical wire or electrical equipment whereby to determine if the voltage originates from a high or low impedance source for the safety of the operator. A bi-impedance probe is connected to the alternating voltage to be analyzed and the voltage signals are processed. The actual probe consists of a first series of uni-directional elements and a second parallel series of high value resistance elements. The output of the parallel connected series of elements is connected to a third series of low value resistance elements. A measuring circuit is connected to the third series of low value resistance elements and is capable of discriminating between the voltage signals from both of the series of resistive elements and is provided with a calculating circuit to determine if the voltage signals originate from a high or low impedance source. The output of the probe is connected to ground. An indicator indicates the condition of the impedance source. An alarm indicator may indicate if a predetermined threshold value, representative of a low impedance source, is exceeded.

8 Claims, 1 Drawing Sheet

FIG. 1

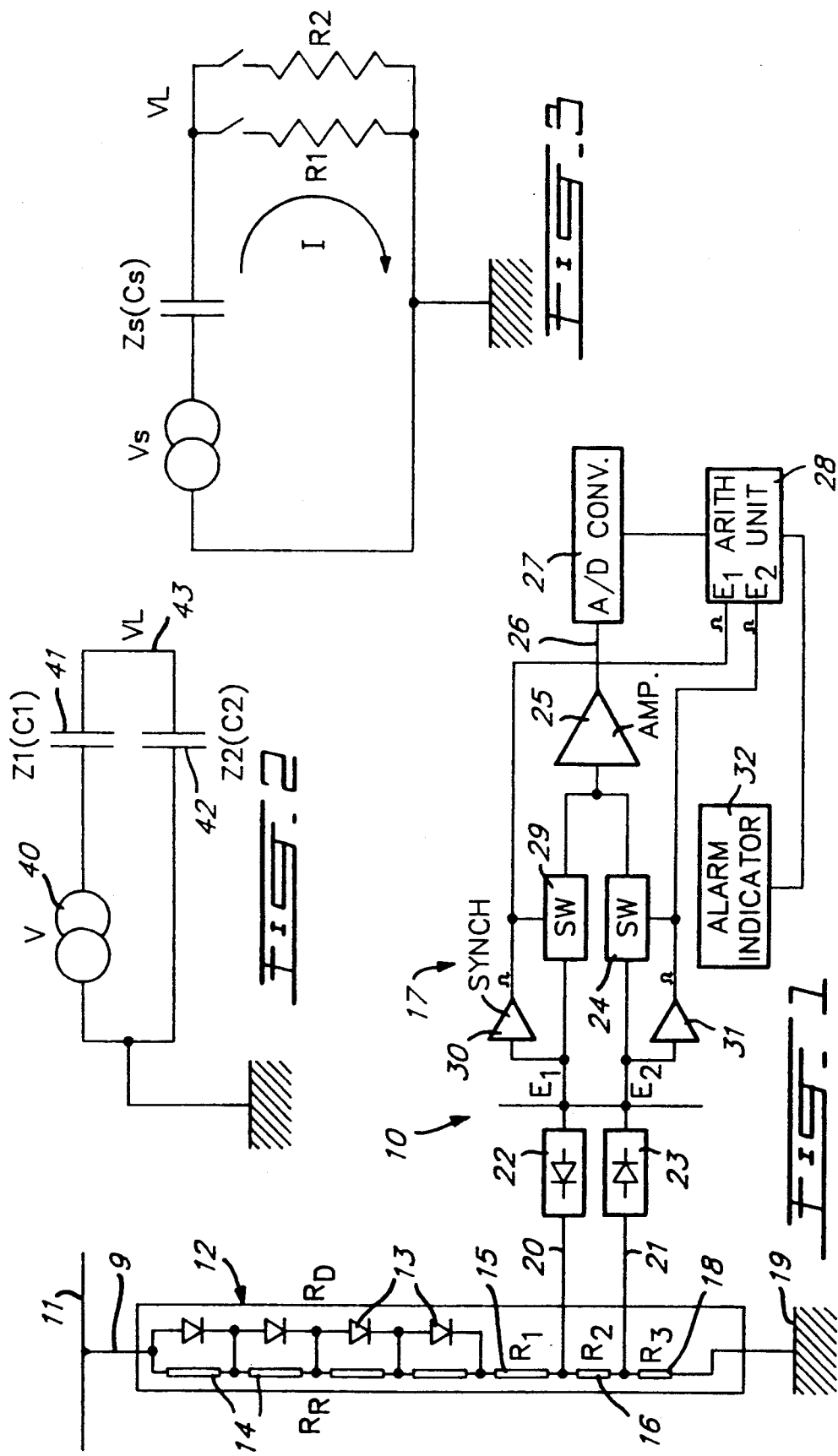

METHOD AND ELECTRICAL MEASURING APPARATUS FOR ANALYZING THE IMPEDANCE OF THE SOURCE OF AN ACTUAL ALTERNATING VOLTAGE

BACKGROUND OF INVENTION

1. Field of the Invention

The present invention relates to an electrical measuring apparatus and a method for analyzing an actual alternating voltage present on an electrical wire or electrical equipment whereby to determine the nature of the impedance source of the alternating voltage and to indicate an alarm condition if the voltage analyzed exceeds a threshold value and is representative of a low impedance source.

2. Description of Prior Art

When a lineman of an electrical utility company needs to work on an electrical power line or in dangerous proximity thereof, without live line work technique, it is imperative for the utility company to disconnect the power from such electrical line or electrical equipment. It is also imperative for the lineman to verify the presence of any voltage on that line before a work procedure is undertaken. In order to evaluate the voltage condition on a line, the lineman will connect a voltage detector on that line. Depending on the type of the voltage detector, the lineman will measure any voltage present thereon, such as induced voltages, or will detect any voltage conditions exceeding a predetermined threshold value. When a voltage is measured, it is up to the lineman to interpret whether the voltage reading, which is on the disconnected line, is dangerous or not, that is to say, if the voltage is derived from a high impedance source such as with induced voltages from adjoining lines or from a low impedance source which is the actual distribution network which is highly dangerous and to which the line may still be connected. Accordingly, an interpretation error can be fatal for the lineman if one was to proceed to install a ground on the line. In order to illustrate this point, we can imagine a dangerous situation where a 25 kV line from which the power has been disconnected breaks and falls on a live 600 volts line. The detector attached to the 25 kV line will indicate a very low voltage relative to the expected voltage and the lineman may therefore interpret this low voltage as being an induced voltage rather than a 600 volts supply from the low impedance distribution network. More dangerous would be the case if the detector would have a threshold where the 600 volts were below the threshold and no danger would be indicated on the voltmeter.

SUMMARY OF INVENTION

It is a feature of the present invention to provide an electrical measuring apparatus for analyzing the actual alternating voltage present on an electrical wire and determining the nature of the alternating voltage to determine if the voltage is from a low or a high impedance source and which substantially overcomes the above-mentioned disadvantages of the prior art.

Another feature of the present invention is to provide a method of analyzing the nature of an alternating voltage present on an electrical wire or electrical equipment to determine if the voltage originates from a high or low impedance source, and which substantially overcomes the above-mentioned disadvantages of the prior art.

According to the above features, from a broad aspect, the present invention provides an electrical measuring apparatus for analyzing the actual alternating voltage present on an electrical wire or electrical equipment to determine the nature of the source of the alternating voltage. The apparatus comprises bi-impedance probe having an output connectible to ground and an input contact element for tapping an alternating voltage to be analyzed. The contact element is connected to a first series of low resistance elements which are conductive only during a half-cycle of the alternating voltage. A low value terminating resistance is connected to an output of the first series of low resistance elements. A second series of high value resistances are connected in parallel with the low resistance elements. The alternating voltage is present across the second series of high value resistances during the other half-cycle of the alternating voltage. A measuring circuit is coupled to the series of low value resistance elements and is capable of discriminating between the voltage signals from both series of resistive elements and is provided with a calculating circuit means to determine if the voltage signals originate from a high or low impedance source. Alarm condition generating means is provided to indicate an alarm condition if a predetermined threshold value, representative of a low impedance source, is exceeded.

According to a further broad aspect of the present invention, there is provided a method of analyzing the nature of an alternating voltage present on an electrical wire or electrical equipment to determine if the voltage originates from a high or low impedance source. The method comprises providing a bi-impedance probe having a first series of low value uni-directional elements and a second parallel series of high value resistances. The parallel, series-connected elements are connected to a series of low value resistance elements. An input of the probe is connected to the electrical wire or equipment so as to produce output voltage signals at an output of the probe and representative of the voltage solely across the series of low value resistance elements and also across the series of low value resistance elements in series with the series of high value resistances. An output of the probe is connected to ground. The output voltage signals are then arithmetically treated at a probe output to determine if they originate from a high or low impedance source. An alarm condition is indicated if a predetermined threshold value, indicative of a low impedance source, is exceeded.

BRIEF DESCRIPTION OF DRAWINGS

A preferred embodiment of the present invention will now be described with reference to the accompanying drawings in which:

FIG. 1 is a schematic diagram illustrating the construction of the bi-impedance probe of the present invention connected to a measuring circuit;

FIG. 2 is a schematic diagram illustrating a simplified mathematical analysis of the source impedance; and FIG. 3 is a further simplified schematic illustrating the mathematical analysis of the source impedance with respect to the current flowing into resistive branches such as the probe of FIG. 1.

DESCRIPTION OF PREFERRED EMBODIMENTS

Referring now to the drawings, and more particularly to FIG. 1, there is shown, generally at 10, the electrical measuring apparatus of the present invention for analyzing an alternating voltage present on an electrical wire 11 or a terminal or other such measuring element on a piece of electrical equipment. The apparatus 10 of the present invention is utilized to determine the nature of the alternating voltage on the line 11 to determine if that voltage originates from a high or a low impedance source, or differently said, if it is the result of capacitive coupling or a live source such as a supply from a distribution network. As herein shown, the apparatus is provided with a bi-impedance probe 12 which is provided with a contact element 9 which receives the alternating voltage on the line 11. The bi-impedance probe is comprised essentially of a first series of low resistance elements, herein a series of forward biased diodes 13 and a parallel series of high value resistors 14. The output of this parallel connection is connected to another series of resistors 15 which has a low value as compared with the series resistances 14. A typical value for the series resistance 15 would be 4 megaohms wherein the series resistances 14 could have a total value of 100 to 200 megaohms.

The output of the series resistance 15 is serially connected to measuring resistances 16 and 18 across which a measuring circuit 17 is connected. The output of the resistive network is connected to the ground 19.

The measuring circuit 17 is provided with a first input 20 and a second input 21. A reverse bias diode 22 is connected to the first input and a forward bias diode 23 is connected to the second input 21. Accordingly, it can be seen that during the positive cycle of the alternating voltage on the line 11, the diodes 13 will conduct and the voltage present on the line 11 will be applied across the series of resistors $R_1$ and the measuring resistances 16 and 18. The voltage at the output of the measuring resistance 18 will produce a voltage signal at the input of a switch 24 which will operate to connect that signal to a buffer amplifier 25 so as to match that signal to the input 26 of an analog to digital converter 27. The converter will treat the analog signal and produce an output digital signal to be fed to an arithmetic unit 28 which will treat the signal in accordance with a mathematical analysis which will be described later. Similarly, during the negative cycle of the voltage signal on the line 11, the voltage at the output of the measuring resistances 16 and 18 will be applied to the input of a second switch 29 which will also connect the voltage to the buffer amplifier 25, to produce a digital signal at the output of the converter 27 to feed the arithmetic unit 28. The synch circuits 30 and 31 condition the arithmetic unit to discriminate between the input voltage signals at the inputs 20 and 21. A signalling or alarm conditioning circuit 32 is coupled to the output of the arithmetic unit 28 and provides a visual and/or audible indication and- /or alarm should the impedance value measured by the arithmetic unit indicate that the alternating voltage on the line 11 originates from a high or a low impedance source. Such indication is derived from comparing these values to threshold values which are programmed within the arithmetic unit 28. A low impedance source would trigger an alarm.

The method of analyzing the voltage signals present at the input of the measuring circuit 17 is effectuated by the following mathematical expression to determine the source impedance wherein:

$$I_{c.c.} = V_s/Z_s$$

where $V_s$ is the source voltage;

$Z_s$ is the impedance source; and $I_{c.c}$ is the short circuit current.

The above mathematical expression was determined by the following mathematical reasoning. We know that if an electrical line is connected to a distribution source that the impedance of the source will be practically nil and that the short circuit current would be enormous. On the other hand, if the electrical line is open and is conductive only through capacitive coupling with other lines in its proximity, the capacity of the current that that line can provide is determined by the quality of the coupling between two lines. If the coupling is bad, the energy present in that line is negligible.

Referring now to FIG. 2, there is shown a schematic representation of the capacitive coupling and the short circuit current available through such coupling. If one could evaluate the source impedance based on this coupling, it would be possible to compare it to a danger threshold reference value to determine if that line is dangerous or not. With reference to FIG. 2, the voltage source is represented by reference numeral 40. The capacitance 41 or $Z_l$ represents the coupling impedance whereas the capacitance 42 represents the impedance of an open line, presumably with no voltage on it but not grounded. The voltage on the line 43, which is connected to a source, is represented here by the expression $V_L$. In a situation where the line is open and connected directly to the distribution network, the coupling impedance 41 or $Z_l$ is close to nil and the voltage on the line is the voltage of the source 40. In the case of a line which is capacitively coupled, the voltage on the line 43 can be expressed by the following mathematical expressions:

$$V_L = V \cdot Z_2/(Z_l + Z_2)$$

or $$V_L = V \cdot C_l/(C_1 + C_2)$$

The relative values of the two impedances $Z_l$ and $Z_2$ determine the level of the voltage on the open line 43. $Z_l$ is a function of the distance of two electrical lines capacitively coupled and the length in which the two lines are extending in parallel relation-ship. $Z_2$ is a function of the distance to ground of the open line and a function of its length.

If we connect the probe 12 of FIG. 1 between ground and an open distribution line, such as line 11 in FIG. 1, the voltage $V_L$ as shown in FIG. 3, will be a function of the value of the load represented by the probe. For a resistive charge $R_l$, the voltage $V_{Ll}$ is represented by the following expression:

$$V_{L1} = V \cdot jwC_1R_1/(jwR_1(C_1+C_2)+1)$$

For a resistive load $R_2$, the voltage $V_{L2}$ would be mathematically expressed as follows:

$$V_{l2} = V \cdot jwC_1R_2/(jwR_2(C_1+C_2)+1)$$

If these equations are expressed in a manner as to isolate the source voltage and by equalling both corresponding expressions to isolate the source impedance $Z_l$, we obtain the following mathematical expression:

$$(V_{l2} - V_{L1})/(I_1 - I_2) = 1/jw(C_1+C_2)$$

wherein $I_1$ is the current circulating in resistance $R_1$ of FIG. 3 and $I_2$ is the current circulating in the resistance $R_2$ of FIG. 3. j is an indicator that the vector is perpendicular and w is $2\pi f$. By expressing the supply voltage and the two capacitances or impedances 41 and 42 of FIG. 2 in the following manner, we can define the source Vs and the impedance source $Z_s$. From the following configurations, we can deduce the following expression for the impedance source:

$$V_{L1} = V_s - Z_s \cdot I_1$$

$$V_{L2} = V_s - Z_s \cdot I_2$$

and wherein:

$$Z_s = (V_{L1} - V_{L2})/(I_2 - I_1)$$

According to the above analysis, $Z_s$ can be expressed as follows:

$$Z_s = 1/jw(C_1 + C_2)$$

and wherein $Z_s$ corresponds to the two parallel impedances 41 and 42 represented by $C_1$ and $C_2$.

The supply Vs can be evaluated vectorially by the following expression:

$$V_s = V_{L1} - Z_s \cdot I_1 \, ou \, V_{L2} - Z_s \cdot I_2$$

$$V_s = I_1(R_1 - i/jw(C_1 + C_2)) ou I_2(R_2 + 1/jw(C_1 - C_2)) \, 0$$

The absolute amplitude of $W_s$ is, therefore $$I_1 \cdot (R_1^2 + 1/w^2(C_1 + C_2)^2)^{\frac{1}{2}}$$

It is also possible to calculate the angle between the current I and the voltage source.

The short circuit current $I_{c.c.}$ is the current that the source can provide in the event where a short circuit is connected to the line or if a lineman was to touch the line before grounding it. This short circuit current is expressed by the following mathematical expression:

$$I_{c.c.} = V_s/Z_s$$

Accordingly, in accordance with the information obtained, by connecting alternatively two resistances which are quite different on the line, we can deduce the following information and namely:

1. the source voltage $V_s$ which exists on the line before it is touched;
2. the source impedance $Z_s$ we can determine if it is nil or close to nil if it is connected to the distribution network; and
3. the short circuit current $I_{c.c.}$ which permits to evaluate if it is safe to install a ground on the line. $I_{c.c.}$ is the current that will flow to ground if a ground was to be installed.

It is within the ambit of the present invention to cover any obvious modifications of the example of the preferred embodiment described herein, provided such modifications fall within the scope of the appended claims. For example, the resistive elements and the probe may have different values than those expressed herein and the measuring circuit 17 can be constructed in many different ways to obtain the desired result.

I claim:

1. An electrical measuring apparatus for analyzing the actual alternating voltage present on an electrical wire or electrical equipment to determine the value of said alternating voltage, said apparatus comprising a bi-impedance probe having an output connectable to ground, and an input contact element for tapping an laternative voltage to be analyzed, said contact element being connected to a first series of low resistance elements which are conductive only during a half cycle of said alternating voltage, a series of low value resistances connected to an output of said first series of low resistance elements, and a second series of high value resistances connected in parallel with said low resistance elements, said alternating voltage being present across said second series of high value resistances during the other half cycle of said laternting voltage, and a measuring circuit coupled to said series of low value resistances and capable of discriminating between said voltage signals from both said series of resistive elements and having calculating circuit means to determine if said voltage signals originate from a high or low impedance source, and an alarm indicator indicates if a predetermined threshold value, representative of a low impedance source, is exceeded.

2. An apparatus as claimed in claim 1 wherein said low resistance elements comprise a series of diodes connected in a forward bias direction from said contact element to conduct during a positive cycle of said alternating voltage, said diodes being capable of withstanding high voltages and having a negligible current conduction during a negative cycle as compared to the current flow in said second series of resistances.

3. An apparatus as claimed in claim 2 wherein said series of low value resistances has a value of 4 megaohms, and series of high value resistances having a total value of 100 or 200 megaohms.

4. An apparatus as claimed in claim 2 wherein said measuring circuit has two inputs connected on a respective side of a resistor connected between other resistances in said series of low value resistances and a second measurement resistor which is connected to ground, one of said two inputs having a forward bias input diode to accept positive voltage signals and block negative voltage signals and the other having a reverse bias input diode to accept said negative voltage signals and block said positive voltage signals.

5. An apparatus as claimed in claim 4 wherein said measuring circuit comprises switch means connected to a respective one of said two input to connect said positive and negative voltage signals in series to a conditioning circuit to feed an analog/digital converter circuit which in turn feeds digital signals representative of said voltage signals to an arithmetical circuit where said signals are analyzed and compared to reference values to generate an output signal to feed said alarm indicator.

6. A method of analyzing the value of an alternating voltage present on an electrical wire or electrical equipment to determine is said voltage originates from a high or low impedance source, said method comprising:
 (i) providing a bi-impedance probe having a first series of low value uni-directional elements and a second parallel series of high value resistances; said parallel series-connected elements being connected to a series of low value resistances;
 (ii) connecting an output of said probable to ground;
 (iii) connecting an input of said probable to said electrical wire or equipment so as to produce output voltage signals at an output of said probe and representative of the voltage solely across said series of low value resistances and also across said series of low value resistances in series with said series of high value resistances;

(iv) arithmetically treating said said output voltage signals at a probe output to determine if they originate from a high or low impedance source; and (v) indicating an alarm condition if said output voltage signals exceed a predetermined threshold value indicative of a low impedance source.

7. A method as claimed in claim 6 wherein said step (i) comprises providing a first series of diodes as said low value uni-directional elements and connecting them in a forward bias direction, said output voltage signals across said series of low value resistances being generated during the positive half cycle of said alternating voltage.

8. A method as claimed in claim 6 wherein said step (iv) comprises effectuating the following mathematical expression to determine the source impedance wherein:

$$I_{c.c.} = V_s/Z_s$$

where
  $V_s$ is the source voltage;
  $Z_s$ is the impedance source; and
  $I_{c.c}$ is the short circuit current.

* * * * *